United States Patent
Yamaguchi et al.

(10) Patent No.: US 8,889,557 B2
(45) Date of Patent: Nov. 18, 2014

(54) SUBSTRATE TREATING METHOD, TEMPORARY FIXING COMPOSITION AND SEMICONDUCTOR DEVICE

(71) Applicant: JSR Corporation, Tokyo (JP)

(72) Inventors: Torahiko Yamaguchi, Tokyo (JP); Seiichirou Takahashi, Tokyo (JP); Hiroyuki Ishii, Tokyo (JP); Katsumi Inomata, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 13/858,948

(22) Filed: Apr. 9, 2013

(65) Prior Publication Data

US 2013/0285217 A1 Oct. 31, 2013

(30) Foreign Application Priority Data

Apr. 27, 2012 (JP) ................................ 2012-102952
Feb. 26, 2013 (JP) ................................ 2013-035744

(51) Int. Cl.
| | | |
|---|---|---|
| C09D 145/00 | (2006.01) | |
| H01L 21/306 | (2006.01) | |
| H01L 29/02 | (2006.01) | |
| C09J 123/00 | (2006.01) | |

(52) U.S. Cl.
CPC ............ H01L 21/306 (2013.01); C09D 145/00 (2013.01); H01L 29/02 (2013.01); C09J 123/00 (2013.01)
USPC ....................................................... 438/694

(58) Field of Classification Search
USPC ............ 257/629; 438/694; 524/265, 366, 378
See application file for complete search history.

(56) References Cited

U.S. PATENT DOCUMENTS

| | | | |
|---|---|---|---|
| 6,004,679 A | * | 12/1999 | Mitchell et al. ............... 428/446 |
| 6,270,900 B1 | * | 8/2001 | Wakizaka et al. ............. 428/416 |
| 7,713,835 B2 | | 5/2010 | Pillalamarri |
| 2008/0200011 A1 | | 8/2008 | Pillalamarri et al. |
| 2009/0218560 A1 | * | 9/2009 | Flaim et al. ........................ 257/9 |
| 2010/0167031 A1 | * | 7/2010 | Leu et al. ....................... 428/212 |
| 2010/0206479 A1 | | 8/2010 | Pillalamarri et al. |
| 2011/0054074 A1 | * | 3/2011 | Jonschker et al. ............. 523/400 |
| 2012/0118511 A1 | * | 5/2012 | Imai et al. ...................... 156/712 |
| 2013/0201635 A1 | * | 8/2013 | Xu .................................. 361/748 |

FOREIGN PATENT DOCUMENTS

JP 2010-506406 2/2010

* cited by examiner

*Primary Examiner* — A. Sefer
(74) *Attorney, Agent, or Firm* — Oblon, Spivak, McClelland, Maier & Neustadt, L.L.P.

(57) ABSTRACT

The invention provides a substrate treating method which can favorably prevent damages to a substrate when the substrate is separated from a support, thus achieving a high yield. The substrate treating method includes, in the sequence set forth, a step ⟨1⟩ of temporarily fixing a substrate onto a support via a temporary fixing material to form a stack, the temporary fixing material including at least a temporary fixing material (I) containing a cycloolefin polymer (A) and a compound (B) having a structure (b1) such as a dialkyl silicone structure, and a structure (b2) such as a polyoxyalkylene structure, a step ⟨2⟩ of processing the substrate and/or transporting the stack, and a step ⟨3⟩ of applying a force to the substrate or the support in a direction substantially perpendicular to the plane of substrate to separate the substrate from the support.

9 Claims, 2 Drawing Sheets

SUBSTRATE TREATING METHOD, TEMPORARY FIXING COMPOSITION AND SEMICONDUCTOR DEVICE

BACKGROUND OF THE INVENTION

1. Field of the Invention

The present invention relates to a method for treating a substrate with a temporary fixing material, to a composition which can form a temporary fixing material suited for temporarily fixing a substrate onto a support during processing of the substrate, and to a semiconductor device.

2. Description of the Related Art

Substrates such as semiconductor wafers need to be temporarily fixed to supports via materials such as temporary fixing materials to make sure that the substrates will not move and become displaced with respect to the supports during processing or transportation. The substrates are separated from the supports after the completion of processing and/or transportation. Several types of adhesives proposed in the art are possibly applicable to the temporary fixation of substrates (see, for example, Patent Literature 1).

Patent Literature 1 describes a wafer bonding and separating method including providing a stack including a first substrate and a second substrate bonded together via a bonding layer; subjecting the stack to a temperature of at least about 190° C. so as to soften the bonding layer; and applying a force to at least one of the first substrate and the second substrate so as to separate the first substrate and the second substrate.

In recent technologies such as photofabrication, substrates are often exposed to a high temperature environment. For example, in a mounting step in the manufacturing of stacked chips, wafers or chips are temporarily fixed to supports, then the wafers or chips are processed (for example, subjected to throughhole formation, bump formation, rewiring, wafer thinning and wafer dicing) and the chips are stacked (for example, a plated metal is melt flowed to form an electrical connection between chips), and the chips are separated from the supports.

In such a case, a temporary fixing material is desirable which allows a substrate to be separated from a support while preventing, for example, wearing or collapse of bumps on the substrate. The bonding method described in Patent Literature 1 achieves a good yield when the substrate to be processed has heat resistant bumps (for example, copper bumps). When the substrate having poorly heat resistant bumps (for example, a bump consisting of a copper portion and a solder portion) is processed, however, the solder portion is softened by a heat treatment at high temperature for separating the substrate, and the bumps are damaged.

Patent Literature 1: JP-A-2010-506406

SUMMARY OF THE INVENTION

It is an object of the present invention to provide a substrate treating method which can favorably prevent damages to a substrate when the substrate is separated from a support, namely, which provides a high yield, as well as to provide a composition as a raw material for a temporary fixing material suitably used for the treating method, and a semiconductor device.

The present inventors carried out studies in order to solve the aforementioned problems. As a result, the present inventors have found that the problems are solved by a temporary fixing material and a treating method having the following configurations. The present invention has been completed based on the finding. For example, the present invention is concerned with the following [1] to [5].

[1] A substrate treating method including, in the sequence set forth, a step ⟨1⟩ of temporarily fixing a substrate onto a support via a temporary fixing material to form a stack, the temporary fixing material including at least a temporary fixing material (I) including a cycloolefin polymer (A) and a compound (B) having at least one structure (b1) selected from diaryl silicone structures, dialkyl silicone structures, fluorinated alkyl structures, fluorinated alkenyl structures and $C_8$ or higher alkyl structures, and at least one structure (b2) selected from polyoxyalkylene structures, phosphoric group-containing structures and sulfo group-containing structures, a step ⟨2⟩ of processing the substrate and/or transporting the stack, and a step ⟨3⟩ of applying a force to the substrate or the support in a direction substantially perpendicular to the plane of substrate to separate the substrate from the support.

[2] The substrate treating method described in [1], wherein the temporary fixing material (I) includes the compound (B) at a content of 0.001 to 10 mass % relative to the mass of the entirety of the temporary fixing material (I).

[3] The substrate treating method described in [1] or [2], wherein the temporary fixing material (I) includes, as the compound (B), a compound having at least one structure selected from dialkyl silicone structures, fluorinated alkenyl structures and $C_8$ or higher alkyl structures, and a polyoxyalkylene structure.

[4] A temporary fixing composition including a cycloolefin polymer (A) and a compound (B) having at least one structure (b1) selected from diaryl silicone structures, dialkyl silicone structures, fluorinated alkyl structures, fluorinated alkenyl structures and $C_8$ or higher alkyl structures, and at least one structure (b2) selected from polyoxyalkylene structures, phosphoric group-containing structures and sulfo group-containing structures.

[5] A semiconductor device obtained by the substrate treating method described in any one of [1] to [3].

The substrate treating method according to the invention can favorably prevent a substrate from being damaged when the substrate is separated from a support, thus achieving a high yield. The inventive composition can be used as a raw material for a temporary fixing material suitably used for the treating method. The semiconductor device of the invention can be obtained advantageously by the inventive substrate treating method.

DESCRIPTION OF THE PREFERRED EMBODIMENTS

Hereinbelow, there will be sequentially described a temporary fixing material of the present invention and a temporary fixing composition that is a raw material for the temporary fixing material, a substrate treating method using the temporary fixing material, and a semiconductor device obtained by the substrate treating method.

1. Temporary Fixing Material

In the present invention, the temporary fixing material is a material that is used to temporarily fix a substrate such as a semiconductor wafer to make sure that the substrate will not move and become displaced with respect to a support during processing or transportation. Examples of the processing include dicing; backgrinding; photofabrication processing such as resist pattern formation, formation of metal bumps by plating or the like, film formation by chemical vapor deposition or the like, and reactive ion etching (RIE). Examples of the transportation include transportation of the substrates between apparatuses.

The temporary fixing material of the invention includes at least a temporary fixing material containing a cycloolefin polymer (A) and a compound (B) described below. Hereinafter, such a temporary fixing material will be also referred to as "a temporary fixing material (I)".

The compound (B) has at least one structure (b1) selected from diaryl silicone structures, dialkyl silicone structures, fluorinated alkyl structures, fluorinated alkenyl structures and $C_8$ or higher alkyl structures, and at least one structure (b2) selected from polyoxyalkylene structures, phosphoric group-containing structures and sulfo group-containing structures.

The temporary fixing material (I) including a cycloolefin polymer (A) exhibits high heat resistance. Thus, the temporary fixing material can prevent damages to substrates themselves or to parts (for example, bumps) formed on the substrates when the substrates undergo operations at high temperatures during processing.

Figure 1:
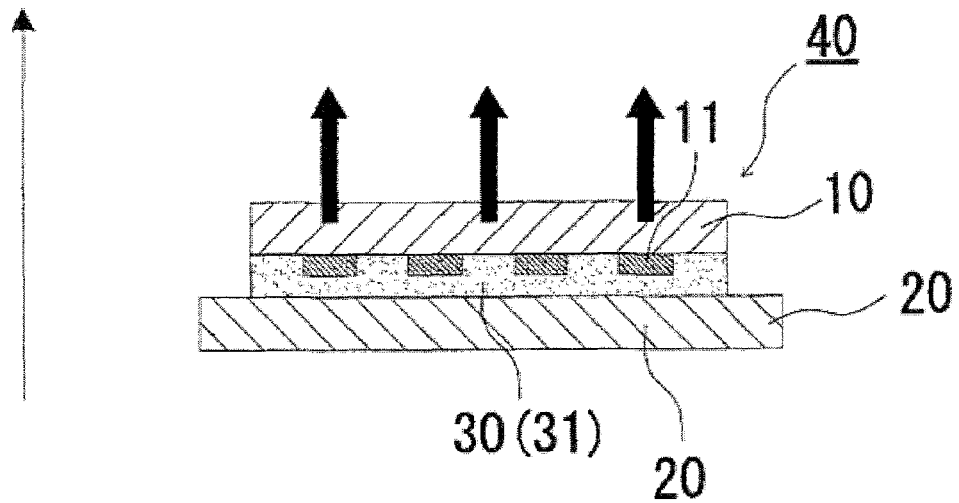
FIG. 1 is a view illustrating that a substrate is separated in a direction substantially perpendicular to the plane of substrate.
Figure 4:
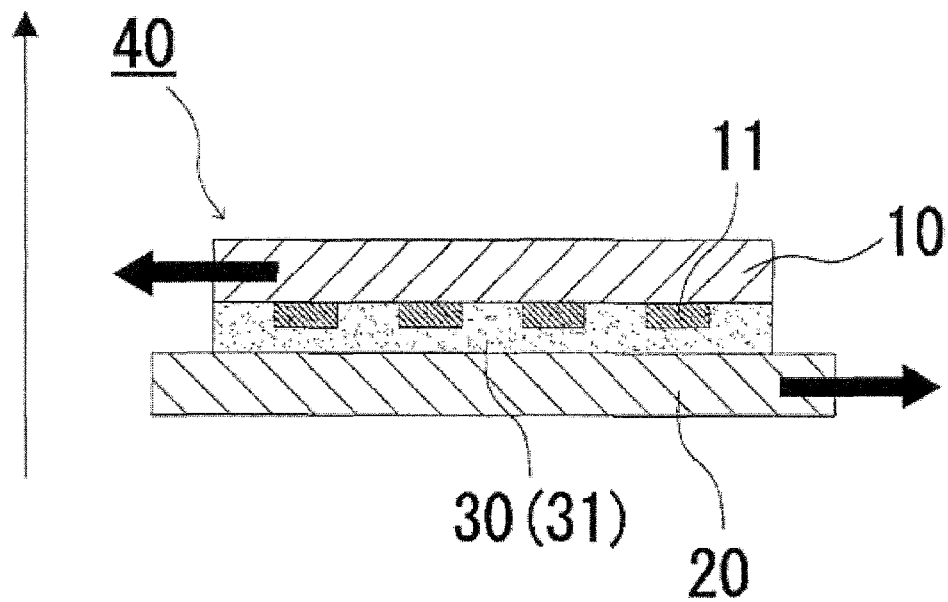
FIG. 4 is a view illustrating that a substrate is separated in a direction substantially parallel to the plane of substrate.

The temporary fixing material (I) including a cycloolefin polymer (A) and a compound (B) exhibits low adhesion when a force is applied in a direction substantially perpendicular to the plane of substrate as illustrated in FIG. 1 (in detail, at an angle of 0° to 60° to an axis (Z axis) perpendicular to the plane of substrate). In contrast, the temporary fixing material (I) exhibits high adhesion when a force is applied in a direction substantially parallel to the plane of substrate as illustrated in FIG. 4. Thus, a substrate may be separated after the completion of processing or transportation by the application of a force in a direction substantially perpendicular to the plane of substrate without any particular heat treatment of the temporary fixing material at a high temperature. Thus, bumps on a substrate are subjected to low shear forces during separation and can be prevented from being collapsed.

The above effects are probably obtained, at least partially, for the following reasons.

In the compound (B), the structure (b1) has a relatively small dipole moment whilst the structure (b2) has a relatively large dipole moment. Thus, the compound (B) can be favorably mixed together with the cycloolefin polymer (A). During the formation of the temporary fixing material from a temporary fixing composition, the compound (B) comes to be present in abundance on the air side of the temporary fixing material due to the surface tension of the temporary fixing composition. As a result, the temporary fixing material will have a zone enriched with the compound (B) on the side in contact with air during the process for the formation of a support/temporary fixing material/substrate stack.

In the case (i) where the temporary fixing material is formed on a substrate, the compound (B) will be concentrated not on the substrate side but on the air side of the temporary fixing material in the temporary fixing material/substrate structure. In the case (ii) where the temporary fixing material is formed on a support, the compound (B) will be concentrated not on the support side but on the air side of the temporary fixing material in the support/temporary fixing material structure.

In the step ⟨2⟩ described later, the retention with respect to a substrate depends on the resistance of the temporary fixing material to shear forces. The temporary fixing material including a cycloolefin polymer (A) exhibits a sufficient resistance to shear forces applied to the temporary fixing material during the step ⟨2⟩. However, the resistance to shear forces is lowered if the compound (B) is present in a large amount. In fact, however, the compound (B) is probably distributed unevenly in the temporary fixing material for the reasons described above. Thus, when a support is provided on the temporary fixing material in the above case (i), the compound (B) has been concentrated on the side of the temporary fixing material in contact with the support. Similarly, when a substrate is provided on the temporary fixing material in the above case (ii), the compound (B) has been concentrated on the side of the temporary fixing material in contact with the substrate. That is, there is a little compound (B) near the center of the temporary fixing material (near the midpoint between the substrate and the support) which is particularly subjected to shear forces. Accordingly, the temporary fixing material exhibits a sufficient resistance to shear forces applied thereto during the step ⟨2⟩. The cycloolefin polymer (A) is excellent in heat resistance and also provides a resistance to chemicals used in photofabrication.

The zone enriched with the compound (B) has low tensile strength when pulled in a direction perpendicular to the plane of substrate. Thus, the zone serves as a starting point of separation in the separation treatment in the step ⟨3⟩ described later, and a substrate can be easily separated from a support by applying a force in the substantially perpendicular direction.

According to the substrate treating method described above, the temporary fixing material (I) including a cycloolefin polymer (A) and a compound (B) allows a substrate to be processed without being damaged so as to ensure a high yield.

In one embodiment, the temporary fixing material of the invention has at least a layer of the temporary fixing material (I). For example, the layer of the temporary fixing material (I) may be formed from a temporary fixing composition (I) including a cycloolefin polymer (A) and a compound (B).

In the temporary fixing material (I), the content of the compound (B) is usually 0.001 to 10 mass %, preferably 0.01 to 8 mass %, and more preferably 0.03 to 6 mass % relative to the mass of the entirety of the temporary fixing material (I). When the content of the compound (B) is not less than the lower limit, the temporary fixing material exhibits low adhesion when a force is applied to pull a substrate or a support in a direction substantially perpendicular to the plane of substrate while the temporary fixing material maintains adhesion resisting a force in a direction substantially parallel to the plane of substrate. The use of the compound (B) in the above range results in sufficiently low adhesion of the temporary fixing material under the application of a force pulling a substrate or a support in a direction substantially perpendicular to the plane of substrate, thus allowing the substrate to be separated without being damaged.

The temporary fixing material of the invention may consist of the temporary fixing material (I), or may have two or more layers including a layer of the temporary fixing material (I) and a layer of another temporary fixing material.

In one embodiment, the temporary fixing material of the invention has at least a layer of a temporary fixing material substantially free from a compound (B) (hereinafter, also referred to as "a temporary fixing material (II)"). For example, the layer of a temporary fixing material (II) may be formed from a temporary fixing composition (II) which does not substantially include a compound (B).

In the temporary fixing material (II), the content of the compound (B) is usually not more than 0.0005 mass %, preferably not more than 0.0001 mass %, and particularly preferably 0 mass % relative to the mass of the entirety of the temporary fixing material (II). In the case where the temporary fixing material (II) includes a cycloolefin polymer (A), the content of the compound (B) is usually less than 0.0005 parts by mass, preferably less than 0.0001 parts by mass, and particularly preferably 0 parts by mass with respect to 100 parts by mass of the cycloolefin polymer (A).

The temporary fixing material of the invention may be configured to have at least one layer of the temporary fixing material (I) and at least one layer of the temporary fixing material (II). In such a case, it is more preferable that the temporary fixing material be of a two-layer structure consisting of a layer of the temporary fixing material (I) and a layer of the temporary fixing material (II).

When the inventive temporary fixing material includes two or more layers, the layer to be adjacent to a substrate is preferably a layer of the temporary fixing material (II). By configuring the temporary fixing material such that the temporary fixing material (II) forms a layer adjacent to a substrate, in particular a substrate having bumps, the collapse of bumps can be prevented more effectively during the separation of the substrate.

The total thickness of the temporary fixing material of the invention may be selected appropriately in accordance with the size of a temporary fixation surface of a substrate as well as the extent of adhesion to be needed during processing and so on. The total thickness of the temporary fixing material of the invention is usually from more than 0.1 μm to 2 mm, preferably from more than 0.1 μm to 1 mm, and more preferably from more than 0.1 μm to 0.5 mm. This total thickness of the inventive temporary fixing material ensures that the temporary fixing material exhibits sufficient retention with respect to a substrate and does not let the substrate become separated from the temporary fixation surface during processing or transportation.

In the case where the inventive temporary fixing material includes two or more layers, the thicknesses of the layers of the temporary fixing materials (I) and (II) are each usually 0.1 to 100 μm, preferably 0.5 to 80 μm, and more preferably 1 to 60 μm.

The temporary fixing material of the invention can temporarily fix a substrate at a temperature of, for example, 300° C. or below, and can maintain a substrate and a support bonded together even in a high-temperature environment such as during reflow soldering (for example, not less than 225° C., in detail 225 to 300° C.). Further, the inventive temporary fixing material can resist shear forces applied during processing such as backgrinding at a temperature in the range from, for example, 0 to 100° C.

As described hereinabove, the inventive temporary fixing material exhibits sufficient retention (shear adhesion) in the presence of shear forces possibly applied thereto during, for example, processing and/or transportation of substrates. The temporary fixing material of the invention can keep substrates held on supports during processing such as substrate thinning at around 25° C., photofabrication, for example etching or sputtered film formation at temperatures in the range from 25 to 300° C., and plating or reflow plating at temperatures in the range from 225 to 300° C.

With these characteristics, the temporary fixing materials of the invention are suitably used as materials for temporarily fixing substrates in various processing in current economic activities, for example, in micromachining of various material surfaces, various surface mounting processes, and transportation of semiconductor wafers and semiconductor elements.

2. Temporary Fixing Composition

For example, a layer of the temporary fixing material (I) may be formed using a temporary fixing composition (I) of the present invention which includes a cycloolefin polymer (A) and a compound (B). For example, a layer of the temporary fixing material (II) may be formed using a temporary fixing composition (II) which does not substantially include a compound (B).

2-1. Temporary Fixing Composition (I)

The temporary fixing composition (I) of the invention includes a cycloolefin polymer (A) and a compound (B). The temporary fixing composition (I) may include, in combination with the cycloolefin polymer (A), a thermoplastic resin (hereinafter, also referred to as "a thermoplastic resin (L)") other than the cycloolefin polymer (A).

⟨ Cycloolefin Polymer (A) ⟩

Examples of the cycloolefin polymer (A) include an addition copolymer of a cyclic olefin compound and a non-cyclic olefin compound, a ring-opening metathesis polymer of one, or two or more kinds of cyclic olefin compounds, and a hydrogenated polymer of the ring-opening metathesis polymer. Methods for synthesizing these cycloolefin polymers are known.

Examples of the cyclic olefin compound include norbornene olefins, tetracyclododecene olefins, dicyclopentadiene olefins, and derivatives of these olefins. Examples of such derivatives include derivatives substituted with a substituent such as an alkyl group, an alkylidene group, an aralkyl group, a cycloalkyl group, hydroxyl group, an alkoxyl group, acetyl group, cyano group, an amide group, an imide group, a silyl group, an aromatic ring, ether bond and ester bond.

The numbers of carbon atoms in the substituents in these derivatives are preferably as follows: The alkyl group preferably has 1 to 20, and more preferably 1 to 10 carbon atoms. The alkylidene group preferably has 1 to 20, and more preferably 1 to 10 carbon atoms. The aralkyl group preferably has 7 to 30, and more preferably 7 to 18 carbon atoms. The cycloalkyl group preferably has 3 to 30, and more preferably 3 to 18 carbon atoms. The alkoxyl group preferably has 1 to 10 carbon atoms.

Suitable examples of the cyclic olefin compound include a compound represented by Formula (1):

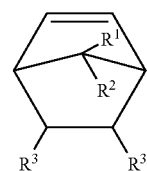

(1)

In Formula (1), $R^1$ to $R^3$ are as follows. $R^1$ and $R^2$ are each independently a hydrogen atom or an alkyl group. $R^3$s are each independently a hydrogen atom, an alkyl group, a cycloalkyl group, an aryl group, an aralkyl group, an alkoxyl group, an alkoxycarbonyl group, aldehyde group, acetyl group or nitrile group. The two $R^3$s may be linked together to form a ring (for example, alicyclic) structure, and such an alicyclic structure may have a substituent selected from the groups mentioned above as $R^3$.

The numbers of carbon atoms in the groups in Formula (1) are preferably as follows: The alkyl group preferably has 1 to 20, and more preferably 1 to 10 carbon atoms. The cycloalkyl group preferably has 3 to 30, and more preferably 3 to 18 carbon atoms. The aryl group preferably has 6 to 18 carbon atoms. The aralkyl group preferably has 7 to 30, and more preferably 7 to 18 carbon atoms. The alkoxyl group preferably has 1 to 10 carbon atoms. The alkoxycarbonyl group preferably has 1 to 11 carbon atoms.

Examples of the non-cyclic olefin compound include a linear or branched olefin having 2 to 20, and preferably 2 to 10 carbon atoms. Ethylene, propylene and butene are more preferable, and ethylene is particularly preferable.

《 Addition Copolymer》

For example, the addition copolymer of a cyclic olefin compound and a non-cyclic olefin compound contains a structural unit represented by Formula (I) and a structural unit derived from a non-cyclic olefin compound (a structural unit resulting from the reaction of a polymerizable double bond of a non-cyclic olefin).

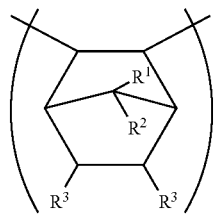

(I)

$R^1$ to $R^3$ in Formula (I) are the same as defined in Formula (1).

Examples of a commercially available addition copolymer include TOPAS manufactured by TOPAS ADVANCED POLYMERS and APEL manufactured by Mitsui Chemicals, Inc.

《 Ring-Opening Metathesis Polymer and Hydrogenated Product Thereof》

For example, the ring-opening metathesis polymer of one, or two or more kinds of cyclic olefin compounds is a polymer containing a structural unit represented by Formula (II). For example, the polymer obtained by hydrogenating the ring-opening metathesis polymer is a polymer containing a structural unit represented by Formula (III).

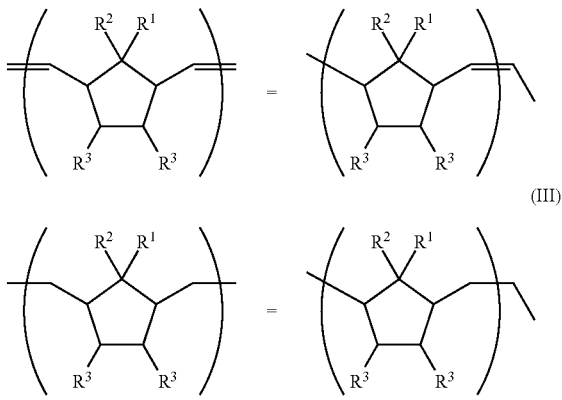

$R^1$ to $R^3$ in Formulae (II) and (III) are the same as defined in Formula (1).

Examples of a commercially available ring-opening metathesis polymer include ZEONOR and ZEONEX manufactured by ZEON CORPORATION, and ARTON manufactured by JSR Corporation.

The cycloolefin polymer (A) usually has a weight average molecular weight (Mw) of 10,000 to 100,000, and preferably 30,000 to 100,000 as measured by gel permeation chromatography (GPC) relative to polystyrenes. The molecular weight distribution Mw/Mn of the cycloolefin polymer (A) is usually 2 to 4, and preferably 3 to 4, wherein Mn is a number average molecular weight of the polymer according to gel permeation chromatography (GPC).

〈 (Thermoplastic Resin (L)〉

The temporary fixing composition (I) of the invention may include a thermoplastic resin (L) other than the cycloolefin polymer (A).

Examples of the thermoplastic resin (L) include petroleum resins, novolak resins and mixtures of these resins. Of these, petroleum resins are preferable because of easy control of the compatibility with the cycloolefin polymer (A).

When the thermoplastic resin (L) is used, the content of the resin (L) in the inventive temporary fixing composition (I) is preferably 0.1 to 150 parts by mass, more preferably 0.5 to 100 parts by mass, and particularly preferably 1 to 80 parts by mass with respect to 100 parts by mass of the cycloolefin polymer (A). This content of the thermoplastic resin (L) is preferable in order to lower the temperature required to accomplish temporary fixing of a substrate to a support as well as to prevent the movement and displacement of a substrate such as a semiconductor wafer with respect to a support during processing or transportation.

《 Petroleum Resin》

Examples of the petroleum resin, which is a suitable thermoplastic resin (L), include $C_5$ petroleum resins, $C_9$ petroleum resins, $C_5/C_9$ mixed petroleum resins, cyclopentadiene resins, vinyl-substituted aromatic compound polymers, olefin/vinyl-substituted aromatic compound copolymers, cyclopentadiene compound/vinyl-substituted aromatic compound copolymers, hydrogenated products of these resins, and mixtures of these resins. Of these, $C_5$ petroleum resins, $C_9$ petroleum resins, $C_5/C_9$ mixed petroleum resins, cyclopentadiene resins, vinyl-substituted aromatic compound polymers, hydrogenated products of these resins, and mixtures of these resins are preferable. The $C_5$ petroleum resins are preferably aliphatic, and the $C_9$ petroleum resins are preferably alicyclic. In particular, $C_9$ petroleum resins, cyclopentadiene resins, hydrogenated products of these resins, and mixtures of these resins are preferable.

The petroleum resin usually has a weight average molecular weight (Mw) of not more than 20,000, preferably 100 to 20,000, more preferably 200 to 10,000, and particularly preferably 300 to 5,000 as measured by GPC relative to polystyrenes.

《 Novolak Resin》

For example, the novolak resin, which is a suitable thermoplastic resin (L), may be obtained by the condensation of a phenol and an aldehyde in the presence of a catalyst (for example, oxalic acid).

Examples of the phenol include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, catechol, resorcinol, pyrogallol, α-naphthol and β-naphthol.

Examples of the aldehyde include formaldehyde, paraformaldehyde, acetaldehyde and benzaldehyde.

Specific preferred examples of the novolak resin include phenol/formaldehyde condensed novolak resin, cresol/formaldehyde condensed novolak resin and phenol-naphthol/formaldehyde condensed novolak resin.

The novolak resin usually has a weight average molecular weight (Mw) of not less than 2,000, and preferably 2,000 to 20,000 as measured by GPC relative to polystyrenes. The molecular weight distribution Mw/Mn of the novolak resin is usually 1 to 10, and preferably 1.5 to 5, wherein Mn is a number average molecular weight of the resin according to GPC.

⟨Compound (B)⟩

The compound (B) has a structure (b1) and a structure (b2).

⟨⟨Structure (b1)⟩⟩

The structure (b1) is at least one selected from diaryl silicone structures, dialkyl silicone structures, fluorinated alkyl structures, fluorinated alkenyl structures and $C_8$ or higher alkyl structures. The structure (b1) has a relatively small dipole moment. This allows the compound (B) to be favorably mixed together with the cycloolefin polymer (A).

For example, the diaryl silicone structure may be represented by Formula (b1-1) or (b1-1').

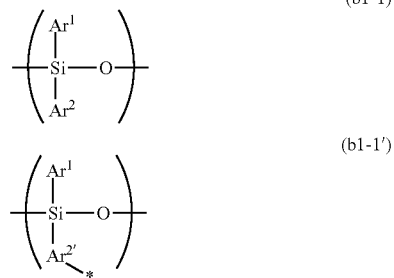

In Formula (b1-1), $Ar^1$ and $Ar^2$ are each independently an aryl group having 6 to 15, and preferably 6 to 10 carbon atoms. In Formula (b1-1'), $Ar^1$ is an aryl group having 6 to 15, and preferably 6 to 10 carbon atoms, $Ar^{2'}$ is an arylene group having 6 to 15, and preferably 6 to 10 carbon atoms, and the asterisk * indicates a bond to the structure (b2) such as a polyoxyalkylene structure.

For example, the dialkyl silicone structure may be represented by Formula (b1-2) or (b1-2').

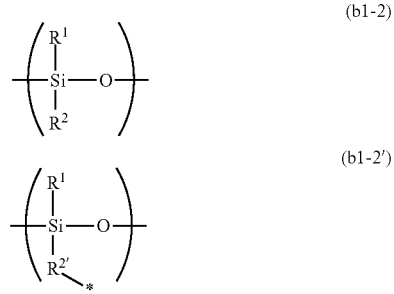

In Formula (b1-2), $R^1$ and $R^2$ are each independently an alkyl group having 1 to 30, and preferably 1 to 20 carbon atoms. In Formula (b1-2'), $R^1$ is an alkyl group having 1 to 30, and preferably 1 to 20 carbon atoms, $R^{2'}$ is an alkylene group having 1 to 30, and preferably 1 to 20 carbon atoms, and the asterisk * indicates a bond to the structure (b2) such as a polyoxyalkylene structure.

For example, the fluorinated alkyl structure is a fluorinated alkyl group having 1 to 30, and preferably 1 to 20 carbon atoms (in which one, or two or more hydrogen atoms in the alkyl group have been replaced by fluorine atoms), and is particularly preferably a perfluoroalkyl group.

For example, the fluorinated alkenyl structure is a fluorinated alkenyl group having 3 to 25, and preferably 5 to 20 carbon atoms (in which one, or two or more hydrogen atoms in the alkenyl group have been replaced by fluorine atoms), and is particularly preferably a perfluoroalkenyl group such as those represented by Formula (b1-3) or (b1-4).

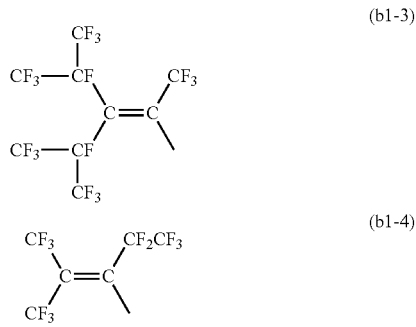

For example, the alkyl structure is an alkyl group having 8 or more, and preferably 8 to 40 carbon atoms, with specific examples including decanyl and octyl groups.

⟨⟨Structure (b2)⟩⟩

The structure (b2) is at least one selected from polyoxyalkylene structures, phosphoric group ($H_2PO_4$—)-containing structures and sulfo group (—$SO_3H$)-containing structures. The structure (b2) has a relatively large dipole moment. Thus, the compound (B) having this structure (b2) and the relatively small dipole moment structure (b1) is distributed unevenly on the air side of the temporary fixing material.

For example, the polyoxyalkylene structure is a group represented by the formula -(A-O)$_n$— (wherein A is an alkylene group having 1 to 20, and preferably 1 to 12 carbon atoms, and n is an integer of 2 to 50, and preferably 2 to 40).

⟨⟨Specific Examples of Compound (B)⟩⟩

Specific examples of the compound (B) will be described below.

Examples of the compound (B) having a dialkyl silicone structure or a diaryl silicone structure, and a polyoxyalkylene structure include a polyether-modified polysiloxane such as POLYFLOW KL-245, KL-270 and KL-700 (manufactured by KYOEISHA CHEMICAL CO., LTD.), TEGO WET 270 (manufactured by Evonik Degussa Japan Co., Ltd.), a compound represented by Formula (B1) (in particular, Formula (B2)) below.

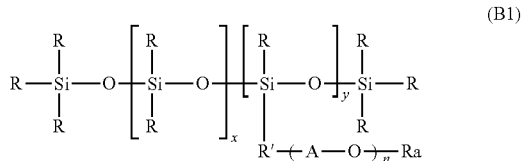

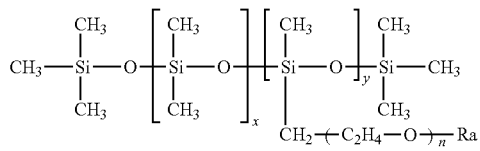

(B2)

In Formula (B1), R is an aryl group having 6 to 15 carbon atoms or an alkyl group having 1 to 30 carbon atoms, R' is an arylene group having 6 to 15 carbon atoms or an alkylene group having 1 to 30 carbon atoms, A is an alkylene group having 1 to 20 carbon atoms, Ra is a hydrogen atom or an alkyl group having 1 to 5 carbon atoms, n is an integer of 2 to 50, and x and y are each independently an integer of 2 to 100.

In Formula (B2), Ra is a hydrogen atom or an alkyl group having 1 to 5 carbon atoms, n is an integer of 2 to 20, and x and y are each independently an integer of 2 to 100.

Examples of a commercially available compound represented by Formula (B2) include SH28PA, SH30PA, SH-8400, SH-190, SH-193 and SF-8428 (manufactured by Dow Corning Toray Co., Ltd.).

Examples of the compound (B) having a fluorinated alkyl structure or a fluorinated alkenyl structure, and a polyoxyalkylene structure include an adduct of a perfluorononenyl ether with a diglycerin ethylene oxide, and a hydroxyl-bridged fluoro polyether. Examples of commercially available such compounds include PolyFox PF-151N (manufactured by OMNOVA Solutions Inc.) and FTERGENT 209F and NBX-15 (manufactured by NEOS COMPANY LIMITED).

Examples of the compound (B) having a $C_8$ or higher alkyl structure and a polyoxyalkylene structure include SY Glyster ML750 (manufactured by Sakamoto Yakuhin Kogyo Co., Ltd.).

Examples of the compound (B) having a phosphoric group-containing structure or a sulfo group-containing structure include perfluorooctanesulfonic acid. Commercially available such compounds include MEGAFACE series (manufactured by DIC Corporation).

Of the compounds described above, the compound (B) having a polyoxyalkylene structure is advantageous in that the use of such compounds is highly effective in order to decrease the adhesion of the temporary fixing material (I) exhibited in a direction substantially perpendicular to the plane of substrate. More preferred compound (B) has at least one structure selected from dialkyl silicone structures, fluorinated alkenyl structures and $C_8$ or higher alkyl structures, as well as a polyoxyalkylene structure.

In the temporary fixing composition (I) of the present invention, the content of the compound (B) is usually 0.001 to 10 mass %, preferably 0.01 to 8 mass %, and more preferably 0.03 to 6 mass % relative to the total solid content of the temporary fixing composition (I) taken as 100 mass %. When the content of the compound (B) is not less than the lower limit, the temporary fixing material exhibits low adhesion when a force is applied to pull a substrate or a support in a direction substantially perpendicular to the plane of substrate while the temporary fixing material maintains adhesion resisting a force in a direction substantially parallel to the plane of substrate. The use of the compound (B) in the above range results in sufficiently low adhesion of the temporary fixing material under the application of a force pulling a substrate or a support in a direction substantially perpendicular to the plane of substrate, thus allowing the substrate to be separated without being damaged.

2-2. Temporary Fixing Composition (II)

The temporary fixing composition (II) does not substantially include a compound (B). Preferably, the temporary fixing composition (II) includes a cycloolefin polymer (A) and does not substantially include a compound (B).

In the temporary fixing composition (II), the content of the compound (B) is usually not more than 0.0005 mass %, preferably not more than 0.0001 mass %, and particularly preferably 0 mass % relative to the total solid content of the temporary fixing composition (II) taken as 100 mass %. In the case where the temporary fixing composition (II) includes a cycloolefin polymer (A), the content of the compound (B) is usually less than 0.0005 parts by mass, preferably less than 0.0001 parts by mass, and particularly preferably 0 parts by mass with respect to 100 parts by mass of the cycloolefin polymer (A).

The temporary fixing composition (II) may include the aforementioned thermoplastic resin (L) in combination with the cycloolefin polymer (A). When the thermoplastic resin (L) is used, the content of the resin (L) in the temporary fixing composition (II) is preferably 0.1 to 150 parts by mass, more preferably 0.5 to 100 parts by mass, and particularly preferably 1 to 80 parts by mass with respect to 100 parts by mass of the cycloolefin polymer (A). This content of the thermoplastic resin (L) is preferable in order to lower the temperature required to accomplish temporary fixing of a substrate to a support as well as to prevent the movement and displacement of a substrate such as a semiconductor wafer with respect to a support during processing or transportation.

In the temporary fixing composition (II), specific examples and preferred examples of the cycloolefin polymer (A) and the thermoplastic resin (L) are as described in the section of "2-1. Temporary fixing composition (I)".

2-3. Preparation of Temporary Fixing Compositions (I) and (II)

The temporary fixing compositions (I) and (II) may be prepared using any of known apparatuses utilized for the processing of thermoplastic resins, such as a twin-screw extruder, a single-screw extruder, a continuous kneader, a roll kneader, a pressure kneader and a Banbury mixer.

In order to allow the composition to exhibit a viscosity suited for application, solvents may be used in the preparation of the temporary fixing compositions (I) and (II). Examples of the solvent include hydrocarbons such as limonene, mesitylene, dipentene, pinene, bicyclohexyl, cyclododecene, 1-tert-butyl-3,5-dimethylbenzene, butylcyclohexane, cyclooctane, cycloheptane, cyclohexane and methylcyclohexane; alcohols/ethers such as anisole, propylene glycol monomethyl ether, dipropylene glycol methyl ether, diethylene glycol monoethyl ether and diglyme; esters/lactones such as ethylene carbonate, ethyl acetate, N-butyl acetate, ethyl lactate, ethyl 3-ethoxypropionate, propylene glycol monomethyl ether acetate, diethylene glycol monoethyl ether acetate, propylene carbonate and γ-butyrolactone; ketones such as cyclopentanone, cyclohexanone, methyl isobutyl ketone and 2-heptanone; and amides/lactams such as N-methyl-2-pyrrolidinone.

The use of solvents facilitates controlling the viscosity of the temporary fixing compositions (I) and (II) and consequently facilitates the formation of the temporary fixing material on the surface such as a substrates or a support. For example, the solvents may be used in such amounts that the total concentration of components of the temporary fixing composition (I) or (II) except the solvents is usually in the range from 5 to 70 mass %, and preferably 15 to 50 mass %.

Where necessary, the temporary fixing compositions (I) and (II) may include particles of metal oxides such as aluminum oxide, zirconium oxide, titanium oxide and silicon oxide, as well as antioxidants, polymerization inhibitors, UV absorbers, adhesion auxiliaries and crosslinked polystyrene particles.

3. Substrate Treating Method

A substrate treating method of the present invention includes, in the sequence set forth, a step ⟨1⟩ of temporarily fixing a substrate onto a support via a temporary fixing material to form a stack, the temporary fixing material including at least the inventive temporary fixing material (I), a step ⟨2⟩ of processing the substrate and/or transporting the stack, and a step ⟨3⟩ of applying a force to the substrate or the support in a direction substantially perpendicular to the plane of substrate to separate the substrate from the support.

These steps ⟨1⟩, ⟨2⟩ and ⟨3⟩ will be described below.

3-1. Step ⟨1⟩

For example, the step ⟨1⟩ may be performed in a manner (1-1) in which a temporary fixing material including at least the inventive temporary fixing material (I) is formed on the surface of a support and/or a substrate, and the substrate and the support are bonded together via the temporary fixing material, thereby temporarily fixing the substrate onto the support. Alternatively, the step ⟨1⟩ may be performed in a manner (1-2) in which a temporary fixing material including at least the inventive temporary fixing material (I) is formed on the surface of a support, and a substrate is formed on the temporary fixing material, thereby temporarily fixing the substrate onto the support. The substrate may be surface-treated beforehand as required.

For example, the temporary fixing material may be formed by a method (i) in which a layer of the temporary fixing material is formed directly on a support and/or a substrate, or a method (ii) in which a layer of the temporary fixing material is formed with a predetermined film thickness on a release-treated PET (polyethylene terephthalate) film and is thereafter transferred onto a support and/or a substrate by lamination. The method (i) is preferable in view of the uniformity in film thickness.

In order to form a layer of the temporary fixing material, the temporary fixing composition may be applied by, for example, a spin coating method or an inkjet printing method. In the case of a spin coating method, for example, the temporary fixing composition may be spin coated at a rotational speed of 300 to 3,500 rpm, preferably 500 to 1,500 rpm, and a rate of acceleration of 500 to 15,000 rpm/sec and for a rotational time of 30 to 300 seconds.

After the temporary fixing composition has been applied, for example, the film may be heated with a heater such as a hot plate to evaporate the solvent. For example, the heating conditions may be such that the temperature is usually 150 to 275° C., preferably 150 to 260° C., and the heating time is usually 2 to 15 minutes, preferably 3 to 10 minutes.

In the method (i), a substrate and a support may be bonded together by, for example, forming a layer of the temporary fixing material on one or both of the substrate and the support and stacking the substrate and the support together via the temporary fixing material layer. The bonding may take place at a temperature selected appropriately in accordance with factors such as the components in the temporary fixing composition, and the application method. In the above manner, the substrate is firmly held on the support via the temporary fixing material. For example, the compression bonding of the substrate and the support may be performed under the application of a pressure of 0.01 to 5 MPa at 150 to 300° C. for 1 to 5 minutes.

Examples of the substrate to be processed (transported) include semiconductor wafers, glass plates, resin plates, metal plates, metal foils, polishing pads and resin films. Semiconductor wafers usually have components such as bumps, wires and insulating films. Exemplary resin films include films containing organic components as a major ingredient. Specific examples include photosensitive resin films formed of photosensitive materials, insulating resin films formed of insulating materials, and photosensitive insulating resin films formed of photosensitive insulating resin materials. Examples of the support include those which are handled easily and have a hard and flat surface, such as glass plates and silicon wafers.

The substrate treating method of the invention may be applied also to the treatment of a substrate such as a semiconductor wafer having bumps, in particular, a semiconductor wafer having poorly heat resistant pillar bumps (for example, a pillar bump consisting of a copper portion and a solder portion). In particular, the inventive method surpasses markedly conventional methods in terms of the effects for the prevention of damages to bumps when a substrate having bumps with an aspect ratio (height/maximum width) of 0.8 or more is separated from a support.

In the formation of a layer of the temporary fixing material on a substrate, the surface of the substrate may be treated beforehand in order to allow the temporary fixing material to be spread evenly over the surface. For example, such surface treatment may be performed by coating the surface of a substrate with a surface treatment agent beforehand.

Examples of the surface treatment agent include coupling agents such as 3-aminopropyl trimethoxysilane, 3-aminopropyl triethoxysilane, 2-aminopropyl trimethoxysilane, 2-aminopropyl triethoxysilane, N-(2-aminoethyl)-3-aminopropyl trimethoxysilane, N-(2-aminoethyl)-3-aminopropylmethyl dimethoxysilane, 3-ureidopropyl trimethoxysilane, 3-ureidopropyl triethoxysilane, N-ethoxycarbonyl-3-aminopropyl trimethoxysilane, N-ethoxycarbonyl-3-aminopropyl triethoxysilane, N-triethoxysilylpropyl triethylenetriamine, N-trimethoxysilylpropyl triethylenetriamine, 10-trimethoxysilyl-1,4,7-triazadecane, 10-triethoxysilyl-1,4,7-triazadecane, 9-trimethoxysilyl-3,6-diazanonyl acetate, 9-triethoxysilyl-3,6-diazanonyl acetate, N-benzyl-3-aminopropyl trimethoxysilane, N-benzyl-3-aminopropyl triethoxysilane, N-phenyl-3-aminopropyl trimethoxysilane, N-phenyl-3-aminopropyl triethoxysilane, N-bis(oxyethylene)-3-aminopropyl trimethoxysilane, N-bis(oxyethylene)-3-aminopropyl triethoxysilane and hexamethyldisilazane.

Figure 2:
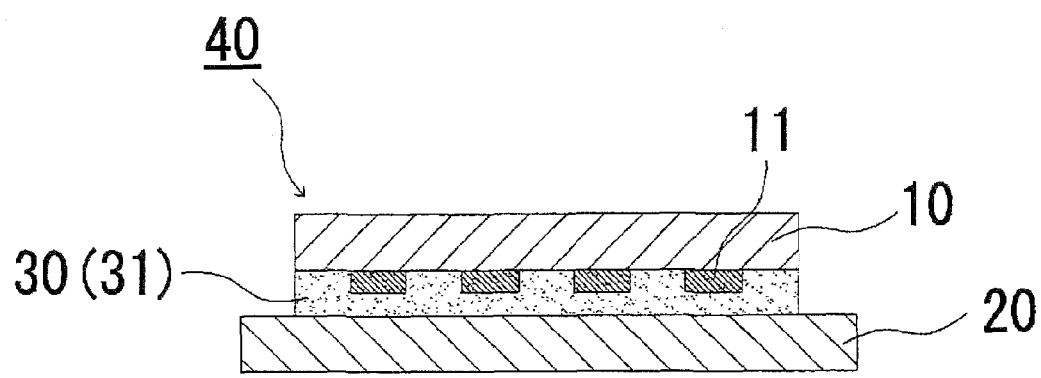
FIG. 2 illustrates a stack including a layer of a temporary fixing material (I)

An example of the stack formed in the step ⟨1⟩ is illustrated in FIG. 2. This stack 40 includes a support 20, a temporary fixing material 30 (a layer of the temporary fixing material (I)) formed on the support 20, and a substrate 10 with bumps 11 that is temporarily fixed on the support 20 via the temporary fixing material 30.

Figure 3:
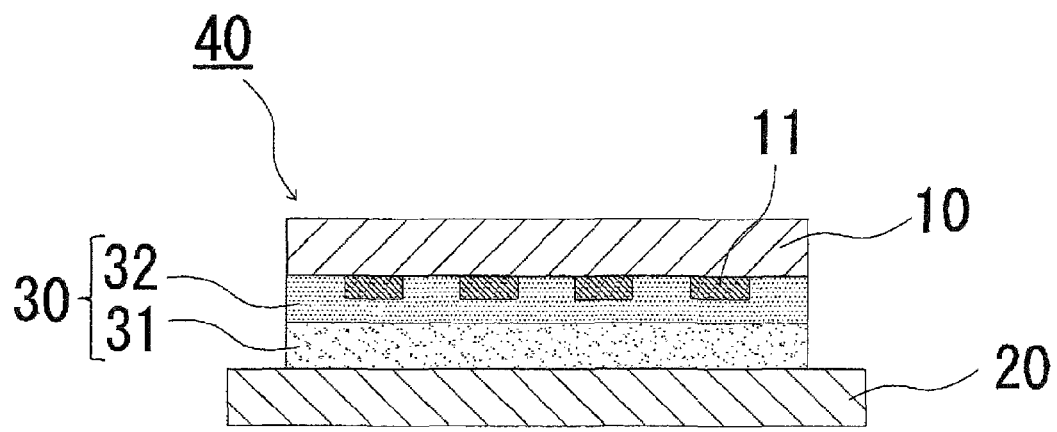
FIG. 3 illustrates a stack including a layer of a temporary fixing material (I) and a layer of a temporary fixing material (II)

Another example of the stack formed in the step ⟨1⟩ is illustrated in FIG. 3. This stack 40 includes a support 20, a temporary fixing material 30 formed on the support 20, and a substrate 10 with bumps 11 that is temporarily fixed on the support 20 via the temporary fixing material 30. The temporary fixing material 30 includes a layer 31 of the temporary fixing material (I) in contact with the support 20, and a layer 32 of the temporary fixing material (II) in contact with the substrate 10.

3-2. Step ⟨2⟩

In the step ⟨2⟩, the substrate temporarily fixed on the support is processed and/or the stack is transported. In this transportation step, the substrate (for example, the semiconductor wafer) together with the support is transported between apparatuses. For example, the processing of the substrate temporarily fixed on the support may be any of substrate thinning (for example, backgrinding); photofabrication including one or more treatments selected from etching, sputtered film formation, plating and reflow plating; and dicing. The present invention is applicable even to the thinning of substrates in which shear forces are mainly applied to the temporary fixing materials.

In photofabrication, resistance (heat resistance) to reflow plating and so on is required. As described above, the substrate treating method of the invention using the inventive temporary fixing materials is excellent in terms of heat resistance.

The implementation of the processing of substrates is not particularly limited provided that the temperature is such that the retention of the temporary fixing materials is not lowered. According to the present invention, the layers of the temporary fixing materials exhibit retention enough to hold (or protect) substrates during processing at a low temperature as well as in a hot environment.

3-3. Step ⟨3⟩

After the processing or transportation of the substrate has completed, the substrate is separated from the support by applying a force to the substrate or the support in a direction substantially perpendicular to the plane of substrate. While FIG. 4 illustrates that a substrate or a support is separated by applying a force in a direction substantially parallel to the plane of substrate, the separation in the present invention is performed as depicted in FIG. 1 by applying a force in a direction substantially perpendicular to the plane of substrate so as to separate the substrate or the support.

If a substrate or a support is separated by a force applied in a direction substantially parallel to the plane of substrate, namely, if the separation is performed utilizing a shear force, bumps on the substrate undergo the shear force during separation and are possibly collapsed. In contrast, the separation taking place in a direction substantially perpendicular to the plane of substrate applies a smaller shear force to bumps on the substrate and can prevent the collapse of bumps during the separation. In particular, the collapse of bumps occurs markedly frequently in a mounting step in the manufacturing of stacked chips in which high aspect ratio bumps (pillar bumps) are employed. Such collapse can be prevented according to the present invention.

In the present invention, a force is applied in a direction substantially perpendicular to the plane of substrate as illustrated in FIG. 1. In the invention, the phrase "a force is applied in a direction substantially perpendicular to the plane of substrate" indicates that a force is applied at an angle of 0° to 60°, preferably 0° to 45°, more preferably 0° to 30°, still more preferably 0° to 5°, and further preferably 0° (perpendicular to the plane of substrate) to an axis (Z axis) perpendicular to the plane of substrate. The substrate or the support is separated by such application of force. The application of force in the above manner ensures that a substrate and a support can be separated from each other without any damages to the substrate, in particular, without any damages to bumps.

The separation of a substrate or a support may be usually performed at 5 to 100° C., preferably 10 to 45° C., and more preferably 15 to 30° C. The temperature herein indicates that of the support.

As already described, there is a little compound (B) near the center of the temporary fixing material (near the midpoint between a substrate and a support) which is particularly subjected to shear forces. Accordingly, the temporary fixing material of the invention exhibits a sufficient resistance to shear forces. On the other hand, the zone of the temporary fixing material on the substrate side or the support side that is enriched with the compound (B) allows the separation to take place easily starting therefrom upon application of a force in a direction substantially perpendicular to the plane of substrate. That is, the temporary fixing material exhibits lower adhesion resisting separation (application of a force) in a direction substantially perpendicular to the plane of substrate compared to in a direction substantially parallel to the plane of substrate. Thus, the temporary fixing material does not require any particular heat treatment at a high temperature to decrease its adhesion, and bumps or the like are prevented from damages.

The separation may be performed in such a manner that a pressure of usually 0.01 to 10000 N/cm$^2$, preferably 0.1 to 3000 N/cm$^2$, and more preferably 0.5 to 100 N/cm$^2$ is applied in a direction substantially perpendicular to the plane of substrate so as to separate a substrate or a support. For example, the separation may take place in such a manner that a periphery of a substrate or a support is lifted (to separate part or the entirety of the periphery from the temporary fixing material) and a force is applied in a direction substantially perpendicular to the plane of substrate so as to allow the separation to continue from the periphery toward the center of the substrate or the support (hook pull mode). In the invention, a substrate and a support may be separated by utilizing these peel forces and configurations.

In order to prevent the substrate from being damaged during separation, a reinforcing tape (for example, a commercial dicing tape) may be attached to the surface of substrate opposite to support.

In the case where the temporary fixing composition remains on the substrate after separation, such a residue may be removed by cleaning with a solvent. Exemplary cleaning methods include soaking the substrate in a cleaning liquid, spraying a cleaning liquid to the substrate, and ultrasonicating the substrate in a cleaning liquid. The temperature of the cleaning liquid is not particularly limited, but is preferably 10 to 80° C., and more preferably 20 to 50° C.

Examples of the solvent include hydrocarbons such as limonene, mesitylene, dipentene, pinene, bicyclohexyl, cyclododecene, 1-tert-butyl-3,5-dimethylbenzene, butylcyclohexane, cyclooctane, cycloheptane, cyclohexane and methylcyclohexane; alcohols/ethers such as anisole, propylene glycol monomethyl ether, dipropylene glycol methyl ether, diethylene glycol monoethyl ether and diglyme; esters/lactones such as ethylene carbonate, ethyl acetate, N-butyl acetate, ethyl lactate, ethyl 3-ethoxypropionate, propylene glycol monomethyl ether acetate, diethylene glycol monoethyl ether acetate, propylene carbonate and γ-butyrolactone; ketones such as cyclopentanone, cyclohexanone, methyl isobutyl ketone and 2-heptanone; and amides/lactams such as N-methyl-2-pyrrolidinone.

A substrate may be separated from a support in the manners described hereinabove.

4. Semiconductor Device

A semiconductor device of the present invention is obtained by the inventive substrate treating method. Because the inventive temporary fixing material can be easily removed at the separation of semiconductor devices (for example, semiconductor elements), the semiconductor devices are highly cleaned of contamination (for example, smears, burnt deposits) due to the temporary fixing material. Further, the inventive semiconductor devices have very little damages or wears of the substrates themselves and parts on the substrates (for example, bumps).

EXAMPLES

The present invention will be described in detail based on examples hereinbelow without limiting the scope of the invention. In the following description, "parts" indicates "parts by mass" unless otherwise mentioned.

The weight average molecular weight (Mw) and the number average molecular weight (Mn) of polymers and resins were measured using GPC columns (two G2000 HXL columns, one G3000 HXL column, one G4000 HXL column) manufactured by TOSOH CORPORATION.

Example 1A

A temporary fixing composition 1 of Example 1A was prepared by mixing, at 25° C., 100 parts of a cycloolefin polymer (product name: ARTON R5300, manufactured by JSR Corporation), 75 parts of a hydrogenated $C_9$ petroleum resin (product name: ARKON P-140, manufactured by ARAKAWA CHEMICAL INDUSTRIES, LTD.), and 0.1 parts of a compound (B1) having a dialkyl silicone structure and a polyoxyalkylene structure (product name: POLYFLOW KL-700, manufactured by KYOEISHA CHEMICAL CO., LTD.).

Examples 2A to 9A and Preparation Example 1A

Temporary fixing compositions 2 to 10 of Examples 2A to 9A and Preparation Example 1A were prepared in the same manner as in Example 1A, except that the components were changed as described in Table 1.

(B2): TEGO WET 270 (product name), manufactured by Evonik Degussa Japan Co., Ltd., a compound having a dialkyl silicone structure and a polyoxyalkylene structure (B3): FTERGENT 209F (product name), manufactured by NEOS COMPANY LIMITED, a compound having a fluorinated alkenyl structure and a polyoxyalkylene structure (B4): SH28PA (product name), manufactured by Dow Corning Toray Co., Ltd., a compound having a dialkyl silicone structure and a polyoxyalkylene structure (B5): NBX-15 (product name), manufactured by NEOS COMPANY LIMITED, a compound having a fluorinated alkenyl structure and a polyoxyalkylene structure (B6): SY Glyster ML750 (product name), manufactured by Sakamoto Yakuhin Kogyo Co., Ltd., a compound having a $C_8$ or higher alkyl structure and a polyoxyalkylene structure Additive:

TINUVIN 479 (product name), manufactured by BASF

Example 1B

The temporary fixing composition 1 was spin coated onto a 4-inch silicon wafer (a substrate) having a plurality of bumps thereon. The coated wafer was heated on a hot plate in the atmosphere at 160° C. for 5 minutes and in a nitrogen atmosphere at 230° C. for 10 minutes to form a film (a temporary fixing material) with a thickness of 30 μm on the substrate. The resultant multilayer structure was cut to a 1 cm×1 cm size. Thus, a plate 1 having the temporary fixing material was obtained.

The size of the bumps was 20 μm in length, 20 μm in width and 20 μm in height. The lower half of the bump on the silicon wafer side was a copper pillar portion and the upper half was a Sn—Ag alloy solder portion.

The plate 1 was bonded to a glass plate (a support having a 2 cm×2 cm square surface) via the temporary fixing material.

TABLE 1

|  | Ex. 1A | Ex. 2A | Ex. 3A | Ex. 4A | Ex. 5A | Ex. 6A | Ex. 7A | Ex. 8A | Ex. 9A | Prep. Ex. 1A |
|---|---|---|---|---|---|---|---|---|---|---|
| Temporary fixing composition | 1 | 2 | 3 | 4 | 5 | 6 | 7 | 8 | 9 | 10 |
| Cycloolefin polymer (A1) | 100 | 100 | 100 | 100 | 100 | 100 | 100 | 100 |  | 100 |
| Cycloolefin polymer (A2) |  |  |  |  |  |  |  |  | 100 |  |
| Hydrogenated petroleum resin | 75 | 75 | 75 | 75 | 75 | 75 | 75 | 75 |  | 75 |
| Compounds (B) Compound (B1) | 0.1 |  |  |  |  |  |  |  | 0.1 |  |
| Compound (B2) |  | 1 |  |  |  | 0.05 |  |  |  |  |
| Compound (B3) |  |  | 1 |  |  |  | 5 |  |  |  |
| Compound (B4) |  |  |  | 1 |  |  |  |  |  |  |
| Compound (B5) |  |  |  |  | 0.1 |  |  |  |  |  |
| Compound (B6) |  |  |  |  |  |  |  | 1 |  |  |
| Additive |  | 3 |  |  |  |  |  | 3 |  | 3 |

The components used in Examples and Preparation Example are described below.

Cycloolefin Polymers (A):

(A1): ARTON R5300 (product name), manufactured by JSR Corporation (A2): ZEONEX 480R (product name), manufactured by ZEON CORPORATION Hydrogenated Petroleum Resin:

ARKON P-140 (product name), manufactured by ARAKAWA CHEMICAL INDUSTRIES, LTD.

Compounds (B):

(B1): POLYFLOW KL-700 (product name), manufactured by KYOEISHA CHEMICAL CO., LTD., a compound having a dialkyl silicone structure and a polyoxyalkylene structure A force of 5 N was applied at 180° C. for 60 seconds using a die bonder. Thus, the silicon wafer and the glass plate were temporarily bonded together via the temporary fixing material.

Visual observation confirmed that there were no gas bubbles between the glass plate and the temporary fixing material. A shear force was applied (at a rate of 500 μm/sec and at 23° C.) in a direction parallel to the plane of substrate with a universal bond tester (DAGE 4000, manufactured by Dage Japan Co., Ltd.). The silicon wafer and the glass plate remained (temporarily) bonded together without any displacement even under the application of 200 N/cm².

Next, a force was applied (at a rate of 500 μm/sec and at 23° C.) to the temporarily fixed plate along an axis (Z axis) perpendicular to the plane of substrate with a universal bond tester (DAGE 4000, manufactured by Dage Japan Co., Ltd.) in a hook pull mode (at 0° to the Z axis). As a result, the glass plate was separated by the application of a force less than 20 N/cm².

the bumps were visually inspected. The bumps were found to have been deformed at the solder portions, which showed that the separation did not take place successfully.

The results are described in Table 2.

TABLE 2

| | Temporary fixing composition | Retention of temporary fixing material (23° C.) | Separation conditions | Bump shape after separation |
|---|---|---|---|---|
| Ex. 1B | 1 | Material resisted 200 N/cm² shear force. | Separation was possible by 20 N/cm² force applied along the axis (Z axis) perpendicular to substrate plane at 23° C. | Good |
| Ex. 2B | 2 | Material resisted 200 N/cm² shear force. | Same as above. | Good |
| Ex. 3B | 3 | Material resisted 200 N/cm² shear force. | Same as above. | Good |
| Ex. 4B | 4 | Material resisted 200 N/cm² shear force. | Same as above. | Good |
| Ex. 5B | 5 | Material resisted 200 N/cm² shear force. | Same as above. | Good |
| Ex. 6B | 6 | Material resisted 200 N/cm² shear force. | Same as above. | Good |
| Ex. 7B | 7 | Material resisted 200 N/cm² shear force. | Same as above. | Good |
| Ex. 8B | 8 | Material resisted 200 N/cm² shear force. | Same as above. | Good |
| Ex. 9B | 9 | Material resisted 200 N/cm² shear force. | Same as above. | Good |
| Ex. 10B | 1 | Material resisted 200 N/cm² shear force. | Separation was possible by 20 N/cm² force applied at 45° to the axis (Z axis) perpendicular to substrate plane at 23° C. | Good |
| Comp. Ex. 1B | 10 | Material resisted 200 N/cm² shear force. | Separation was impossible even by 20 N/cm² force applied along the axis (Z axis) perpendicular to substrate plane at 23° C. | — |
| Comp. Ex. 2B | 1 | Material resisted 200 N/cm² shear force. | Separation was possible by 20 N/cm² force applied in parallel to substrate plane at 230° C. | Solder portions were deformed. |

After the separation, the residual temporary fixing material on the plate 1 was removed by cleaning with mesitylene, and the bumps were visually inspected. The bumps were found to be free of deformation, and the separation was accomplished successfully.

Examples 2B to 9B and Comparative Example 1B

The procedures in Example 1B were repeated, except that the temporary fixing composition was changed as described in Table 2. The results are described in Table 2.

Example 10B

A force was applied (at a rate of 500 μm/sec and at 23° C.) to the temporarily fixed plate obtained in Example 1B at an angle of 45° to an axis (Z axis) perpendicular to the plane of substrate with a universal bond tester (DAGE 4000, manufactured by Dage Japan Co., Ltd.). As a result, the glass plate was separated by the application of a force less than 20 N/cm².

Comparative Example 2B

A force was applied (at a rate of 500 μm/sec and at 230° C.) to the temporarily fixed plate obtained in Example 1B in a direction parallel to the plane of substrate with a universal bond tester (DAGE 4000, manufactured by Dage Japan Co., Ltd.). As a result, the glass plate was separated by the application of a force less than 20 N/cm².

After the separation, the residual temporary fixing material on the plate 1 was removed by cleaning with mesitylene, and

REFERENCE SIGNS LIST

10 a substrate (for example, a silicon wafer)
11 bumps
20 a support
30 a temporary fixing material
31 a temporary fixing material (I)
32 a temporary fixing material (II)
40 a stack

What is claimed is:

1. A substrate treating method comprising, in the sequence set forth:

a step ⟨ 1 ⟩ of temporarily fixing a substrate onto a support via a temporary fixing material to form a stack, the temporary fixing material comprising at least a temporary fixing material (I) comprising
   a cycloolefin polymer (A) and
   a compound (B) having at least one structure (b1) selected from diaryl silicone structures, dialkyl silicone structures, fluorinated alkyl structures, fluorinated alkenyl structures and $C_8$ or higher alkyl structures, and at least one structure (b2) selected from polyoxyalkylene structures, phosphoric group-containing structures and sulfo group-containing structures, a step ⟨ 2 ⟩ of processing the substrate and/or transporting the stack, and a step ⟨ 3 ⟩ of applying a force to the substrate or the support in a direction substantially perpendicular to the plane of substrate to separate the substrate from the support.

2. The substrate treating method according to claim 1, wherein the temporary fixing material (I) comprises the compound (B) at a content of 0.001 to 10 mass % relative to the mass of the entirety of the temporary fixing material (I).

3. The substrate treating method according to claim 2, wherein the temporary fixing material (I) comprises, as the compound (B), a compound having at least one structure selected from dialkyl silicone structures, fluorinated alkenyl structures and $C_8$ or higher alkyl structures, and a polyoxyalkylene structure.

4. A semiconductor device obtained by the substrate treating method described in claim 3.

5. A semiconductor device obtained by the substrate treating method described in claim 2.

6. The substrate treating method according to claim 1, wherein the temporary fixing material (I) comprises, as the compound (B), a compound having at least one structure selected from dialkyl silicone structures, fluorinated alkenyl structures and $C_8$ or higher alkyl structures, and a polyoxyalkylene structure.

7. A semiconductor device obtained by the substrate treating method described in claim 6.

8. A semiconductor device obtained by the substrate treating method described in claim 1.

9. A temporary fixing composition comprising
a cycloolefin polymer (A) and
a compound (B) having at least one structure (b1) selected from diaryl silicone structures, dialkyl silicone structures, fluorinated alkyl structures, fluorinated alkenyl structures and $C_8$ or higher alkyl structures, and at least one structure (b2) selected from polyoxyalkylene structures, phosphoric group-containing structures and sulfo group-containing structures.

* * * * *